United States Patent [19]

Aslam et al.

[11] Patent Number: 4,912,087

[45] Date of Patent: Mar. 27, 1990

[54] RAPID THERMAL ANNEALING OF SUPERCONDUCTING OXIDE PRECURSOR FILMS ON SI AND SIO₂ SUBSTRATES

[75] Inventors: Mohammad Aslam, Farmington Hills; Eleftherios M. Logothetis, Birmingham; Richard E. Soltis, Redford, all of Mich.

[73] Assignee: Ford Motor Company, Dearborn, Mich.

[21] Appl. No.: 181,863

[22] Filed: Apr. 15, 1988

[51] Int. Cl.⁴ ............................................. C23C 14/00
[52] U.S. Cl. ........................................... 505/1; 427/62; 427/63; 427/255.3; 427/126.3; 204/192.24; 428/702
[58] Field of Search ............. 427/62, 63, 255.3, 126.3; 505/1, 742; 204/192.24; 428/702

[56] References Cited

U.S. PATENT DOCUMENTS 4,316,785  2/1982  Suzuki et al. ........................ 427/63

OTHER PUBLICATIONS

Gurvitch et al "Preparation and Substrate Reactions of Superconducting Y—B$_a$—Cu—O Films", Appl. Phys. Lett 51(13) p. 1027 (1987).
Lathrop et al "Production of YB$_a$Cu$_3$O$_{7-y}$ Superconducting Thin Films In Situ by High-Pressure Reactive Evaporation and Rapid Thermal Annealing", Appl. Phys. Lett. 51(19) p. 1554 (1987).
Bullock et al. "Production of Superconducting Y$_1$Ba$_2$Cu$_3$O$_x$ Thin Films by D.C. Diode Sputtering and Annealing", AIP Conf. Proc. No. 165 p. 71 (1988).
S. Y. Lee et al "Microprobe Characterization of Sputtered High Tc Superconducting Films on Silicon", AIP Conf. Proc. No. 165 p. 427 (1988).
Mogro-Campero et al "High Temperature Superconductors II", MRS edited by Capone et al, Pittsburgh, 1988, p. 113.
S. J. Lee et al. "Preparation of Y—B$_a$-Cu—O Thin Films on MgO by dc Magnetron Sputtering From a Stoichiometric Y$_1$Ba$_2$Cu$_3$O$_{7-w}$ Target", Appl. Phys. Lett. 51(15) p. 1194 (1987).

Primary Examiner—Norman Morgenstern
Assistant Examiner—Roy V. King
Attorney, Agent, or Firm—Lorraine S. Melotik; Roger L. May

[57] ABSTRACT

This invention is directed to a method of preparing a superconducting metal oxide film on silicon and silicon dioxide substrates. More particularly, the method comprises depositing by physical vapor deposition a superconducting metal oxide precursor directly on the substrate and then subjecting it to rapid thermal annealing in an oxygen atmosphere.

9 Claims, 3 Drawing Sheets

RAPID THERMAL ANNEALING OF SUPERCONDUCTING OXIDE PRECURSOR FILMS ON SI AND SIO₂ SUBSTRATES

TECHNICAL FIELD

This invention relates to a method of preparing a superconducting metal oxide film on silicon and silicon dioxide substrates.

BACKGROUND OF THE INVENTION

The recent discovery of superconducting metal oxides such as $YBa_2Cu_3O_{7-y}$ (with $y<0.5$) having critical temperatures, $T_c$, at least 10 to 20 K. above the temperature of liquid nitrogen (77 K.) has created a great deal of excitement. Heretofore known superconducting materials have much lower $T_c$'s. These superconducting metal oxides have vast potential for use in diverse applications in the large number of electrical and electronic devices which can operate at these higher temperatures. One important use of such metal oxides is in electronic components, where the oxide materials would generally be employed as a thin film, usually less than 10 μm thick, deposited on an appropriate substrate.

During the past 12 months, a great deal of effort has been devoted to the preparation of superconducting films of $YBa_2Cu_3O_{7-y}$ on various substrates. Many different techniques for depositing the film on a substrate have been explored. The film has been grown (deposited) on substrates by physical deposition techniques including electron beam evaporation, sputtering, molecular beam epitaxy, ion beam deposition, laser deposition and chemical deposition techniques such as metalorganic deposition. However, in general, the as deposited films of such materials are nonsuperconducting. They require a post growth anneal in oxygen to become superconducting. To effect the desired superconducting properties in the film material, they are usually annealed in oxygen at a temperature of 800°–950° C. and for a period of a few minutes to a few hours.

If the annealing conditions are excessive, however, they can have an adverse effect on the superconducting properties of the film by causing interdiffusion of elements of the film and the substrate. The interdiffusion can lead to interactions of the elements and result in films having poor or absent superconducting properties. Annealing temperatures and times therefore have to be optimized for a given substrate and thickness of the film.

Recent publications have described various physical deposition techniques and annealing conditions which are reported to have been successfully used to produce superconducting metal oxide films on special substrates such as $SrTiO_3$, $ZrO_2$ and MgO. In "Preparation Of Y-Ba-Cu-O Thin Films On MgO By dc Magnetron Sputtering From A Stoichiometric $Y_1Ba_2Cu_3O_{7-\delta}$ Target", Lee et al, Appl. Phys. Lett. 51 (15), Oct. 12, 1987 it was disclosed that such thin films deposited on MgO substrates, when heated above 900° C. for 1 minute become superconducting at 60 K. D. K. Lathrop et al in "Production of $YBa_2Cu_3O_{7-y}$ Superconducting Thin Films in Situ by High-Pressure Reactive Evaporation and Rapid Thermal Annealing", Appl. Phys. Lett. 51 (19) Nov. 9, 1987 deposited such films on $Al_2O_3$, $ZrO_2$ and $SrTiO_3$. They teach therein that, after deposition, films which did not show good superconducting properties were annealed in flowing oxygen for 1–5 minutes at 700°–900° C. in an attempt to improve the superconducting properties.

While the above citations are directed to films deposited by physical deposition techniques, the following citation is directed to films deposited by a chemical deposition technique, namely organometallic deposition. In "Versatile New Metalorganic Process For Preparing Superconducting Thin Films," Appl. Phy. Lett. 52 (2), Jan. 11, 1988, M. E. Gross et al disclose depositing $LnBa_2Cu_3O_{7-x}$, (Ln being a rare earth element) films on MgO and $ZrO_2$ by spin coating the film from a solution. It is taught therein that heating in $O_2$ to a maximum temperature of 800°–990° C. followed by annealing at 400° C. produces superconducting behavior in the film at $T_c$ (onset) of 89 K. The high temperature annealing of the film is limited to a maximum of 3 minutes in order to preclude significant interaction of the film with the substrate.

In all of these citations, the typical annealing schedule consists of a relatively slow heating to a peak temperature in the range of 850° to 950° C., annealing in oxygen at this temperature for a time period ranging from a few minutes to an hour, followed by a slow cooling at a rate of 1 to 3 degrees per minute. Using such an annealing schedule, $YBa_2Cu_3O_{7-y}$ films having $T_c$'s above 90 K. and critical current densities above $10^6$ A/cm² have been reported in the literature as having been made on the particular substrates mentioned above.

For most electronic uses, however, the superconducting films must be grown on substrates employed in integrated circuits, such as Si, $SiO_2$ and $Si_3N_4$ substrates. Unfortunately all attempts known to us by others in the past to prepare $YBa_2Cu_3O_{7-y}$ films by physical deposition techniques on silicon and silicon dioxide substances have given films having poor superconducting properties, i.e., low $T_c$'s. When we used the typical annealing schedule described above to anneal films deposited by a physical deposition on Si and $SiO_2$ as we had used for films deposited, for example, on $SrTiO_3$, we obtained results similar to those reported in the literature, namely, the films had poor superconducting properties. Generally, such films vapor deposited on silicon have a $T_c$ less than 30 K. The poor superconducting properties are attributed to the interdiffusion of one or more of the elements of the film and substrate.

In a paper presented in Nov. of 1987 by Robert B Laibowitz and entitled "Vapor Deposited High $T_c$ Superconducting Oxide Thin Films" it was reported that thin films of the compound $YBa_2Cu_3O_y$ were deposited on substrates such as sapphire, MgO, $ZrO_2$, $SrTiO_3$, Si and $SiO_2$. Annealing was carried out in oxygen in a conventional furnace generally at temperatures around 920° C. for about 4 minutes and the samples were cooled slowly to room temperature in the furnace. The films on all of the substrates of the paper listed above, other than Si and $SiO_2$, were reported to be superconducting. Superconducting properties were not reported for films deposited on Si or $SiO_2$ and it must be inferred that Laibowitz was not successful in making superconducting films on the silicon and silicon dioxide substrates. Similarly, in an article in the Detroit Free Press on Mar. 17, 1988, General Electric is quoted as stating that "Previous attempts to apply a superconducting film on silicon had failed because the layers mixed in the process of heating the film, known as annealing". According to that article, scientists at GE addressed the problem by using a buffer layer of zirconia, a heat resistant metallic oxide. It was reported that superconductive films having a $T_c$ of 87 K. were obtained by using the buffer layer of zirconia between the film and the silicon substrate.

In "High $T_c$ Superconducting Films From Metallo-Organic Precursors", W. W. Davison et al, it was reported that films of $YBa_2Cu_3O_{7-x}$ deposited on silicon by metalorganic deposition have a $T_c$ of about 80 K. Reportedly, the film was about 0.7 μm thick and was annealed in oxygen for one hour at 900° C. It was also suggested in this reference that a diffusion barrier such as silver might be used between the film and the silicon. If this work is substantiated, it represents an advance in the art but provides teachings regarding only films deposited by a non-physical deposition technique i.e., a non-vacuum-type metalorganic deposition technique.

It is still desirable, however, to use physical deposition techniques to make good superconducting films of YBaCuO, particularly $YBa_2Cu_3O_{7-y}$, on silicon and silicon dioxide substrates, which films do not require a buffer layer to insure good superconducting properties in the film. It is an object of the invention to provide a method for making high $T_c$ superconducting metal oxide films on silicon and silicon dioxide substrates, wherein the precursor (non-superconducting) film is deposited on the substrate by physical deposition techniques, which films further do not require a buffer layer between the film and substrate to insure a finished film of good superconducting properties.

BRIEF DESCRIPTION OF THE INVENTION

We have found that in order to produce superconducting metal oxide films from precursor films deposited by physical deposition techniques on silicon or silicon dioxide, which do not require a buffer layer, the heating, annealing and cooling of the film must be critically controlled to periods of time substantially shorter than those now being suggested by others.

This invention relates to a method of making a superconducting metal oxide film on a silicon or silicon dioxide substrate. According to the method, a thin film of a superconducting metal oxide precursor consisting essentially of R, Ba, Cu, and O is deposited by a physical deposition technique onto the substrate in a thickness of between about 0.1 and about 3 μm (microns) to form a film/substrate composite, which precursor film can be annealed in an oxygen atmosphere to yield a superconducting metal oxide film. R is selected from the group consisting of rare earth elements and yttrium. As is apparent to one skilled in the art in view of the present disclosure, R may also be a mixture of materials selected from this group. Preferably, the (atomic) ratio of R:Ba:Cu present in the deposited superconducting metal oxide precursor is about 1:2:3, i.e., 0.8–1.2:1–.8–2.2:2.8–3.2, most preferably being the stoichiometric 1:2:3. The film/substrate composite is heated to a temperature between about 800° C. and 950° C., preferably 850°–950° C., in less than about 10 seconds. The film substrate composite is maintained at the temperature in an oxygen atmosphere for between about 5 and 25 seconds to anneal the film. The "oxygen atmosphere" as that term is used herein, is an atmosphere comprising at least 10% by volume oxygen any remainder other than oxygen being non-reactive gas(es). Preferably, the oxygen atmosphere of the invention consists essentially of oxygen, i.e, is about 100% oxygen. The composite is then cooled to less than about 300° C., preferably to room temperature, in less than about 3 minutes, preferably in about 30 to 80 seconds. Generally, in the cooling of the composite to less than about 300° C. in less than about 3 minutes, the composite is preferably cooled to less than about 400° C. in less than 10 seconds. Hereinafter, the heating, annealing and cooling of the metal oxide film according to this invention will be referred to as "rapid thermal annealing".

If the substrate is silicon, preferably the annealing time (i.e., the time for which the composite is maintained in the oxygen atmosphere at the elevated temperature) is 8 to 12 seconds and if the substrate is silicon dioxide the annealing time preferably is 10 to 15 seconds.

The invention is also directed to an article comprising a superconducting metal oxide film on a substrate selected from the group consisting of silicon and silicon dioxide made according to the method disclosed above. As understood herein, the term "superconductor" with respect to the metal oxide film means that it is superconductive at cryogenic temperatures.

Advantageously metal oxide films made on silicon according to this invention have shown zero resistance near 50K., as compared to prior art films made on silicon by conventional annealing schedules which have zero resistance below 30K. The superconducting metal oxide film, according to this invention after annealing in an oxygen atmosphere, preferably consists essentially of $RBa_2Cu_3O_{6.5-7}$.

DETAILED DESCRIPTION OF THE INVENTION

Figure 1:
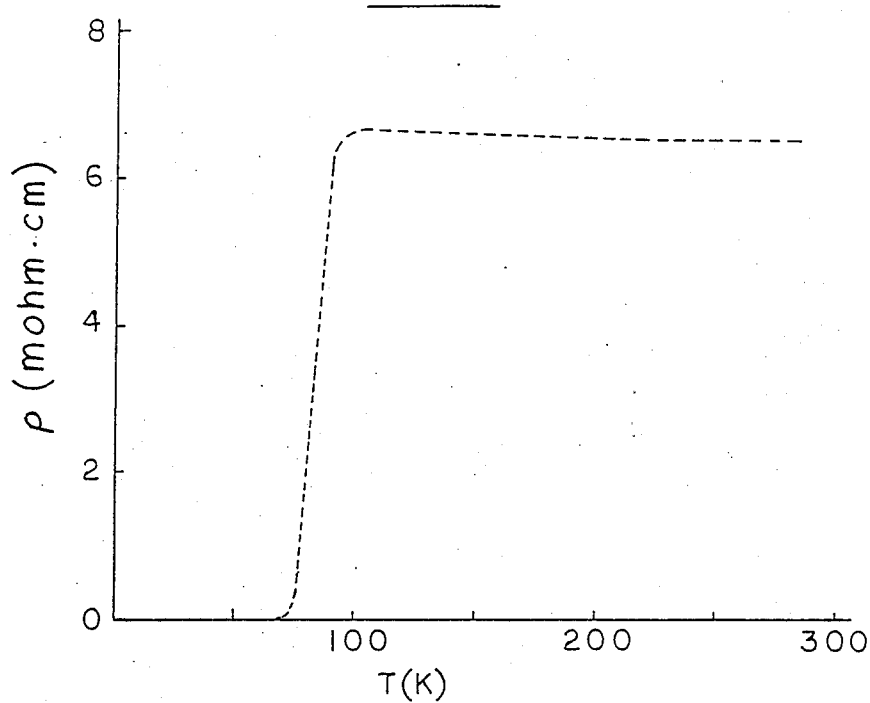
FIG. 1 is a graphical representation of the resistivity versus temperature for a Y/Ba/Cu/O film on sapphire substrate which was annealed in an oxygen atmosphere according to conventional annealing schedules.

This invention is directed to a method of making a superconducting metal oxide film on silicon and silicon dioxide substrates. The method comprises depositing a thin film of a superconducting metal oxide precursor on silicon or silicon dioxide substrates by physical deposition techniques and then subjecting the film to rapid thermal annealing in an oxygen atmosphere to make it superconducting. The steps of the method will hereinafter be described in greater detail.

The silicon and silicon dioxide substrates may be of any type of such material and in any desired shape. If the film/substrate is intended for use in electronic devices, however, the substrate would probably be in the form of a wafer as is commonly used in the electronics industry. A wafer of silicon may be in the shape of a disc having two broad faces and a thin cylindrical edge surface or may be a rectangular solid having two broad faces and four thin edge surfaces. The silicon substrate may be, e.g., intrinsic, p-type or n-type, and have doping levels as are commonly used in the semiconductor industry. Generally, for electronic use the substrate would be a wafer of single crystal silicon, most preferably being single crystal silicon of (100) or (110) orientation, or be a wafer of single crystal silicon on which a silicon dioxide layer has been grown.

Prior to deposition of a film onto a silicon substrate, the surface of the silicon is preferably cleaned to remove any contaminants, e.g., organic or inorganic impurities, which may interfere with the adhesion of the film to the substrate or the electrical conductivity at the film/substrate interface. Such cleaning is routinely carried out by, e.g., using vapors of isopropyl alcohol or a solution of $H_2O_2$ and $H_2SO_4$ followed by a deionize water rinse. In the case of silicon, the substrate may subsequently be etched in buffered HF to remove any native oxide and then rinsed in deionized water. Thereafter, the silicon may be spin-dried in a nitrogen atmosphere. For optimal adhesion of the film to the silicon substrate surface, however, the chemically cleaned substrate surface is also preferably glow discharged sputter-cleaned in the deposition chamber prior to deposition of the metal oxide film.

The silicon dioxide may be formed by oxidizing a silicon substrate (which technique is well known in the art). One technique for growing the silicon dioxide on the silicon substrate by oxidizing a silicon substrate (which technique was employed in the examples below) is hereinafter described. Generally the surface of the silicon would be cleaned first according to the cleaning procedures described above. Thereafter, to grow the silicon dioxide layer, the silicon substrate is loaded into a furnace in a nitrogen atmosphere at an elevated temperature, e.g., 800° C. The temperature is raised to e.g., 1000° C., and the nitrogen gas is replaced with dry oxygen gas. After sufficient oxidation of the silicon to form a silicon dioxide film on the silicon wafer, the gas is switched back to nitrogen and the substrate is annealed, preferably for about 30 minutes. It is preferable when using as the silicon dioxide substrate a silicon dioxide film grown on silicon in this manner to saturate the oxide film by further exposure to another oxygen anneal for times much shorter (approximately 30 seconds) than the actual oxidation times. Following this anneal, the gas is again switched back to nitrogen while the temperature is lowered. Other techniques for growing silicon dioxide layers on silicon will be apparent to those skilled in the art in view of the present disclosure. A cleaned silicon substrate and the silicon substrate on which has been grown a silicon dioxide layer generally would be stored in air-tight containers prior to deposition thereon of the superconducting metal oxide precursor film. While one technique for obtaining a silicon dioxide substrate, i.e., oxidizing silicon, has been described as suitable for obtaining a silicon dioxide substrate, the silicon dioxide substrate of the invention is not limited to silicon dioxide substrates obtained in this way. For example, quartz, a commercially available form of silicon dioxide, may also be used as the silicon dioxide substrate.

The superconducting metal oxide precursor film deposited on the silicon or silicon dioxide substrate according to the invention disclosed herein consists essentially of R, Ba, Cu and O. Preferably, the atomic ratio of R:Ba:Cu in the precursor film is about 1:2:3, most preferably being the stoichiometric 1:2:3. R is selected from the group of elements consisting essentially of rare earth elements and yttrium. The rare earth elements are well known to those skilled in the art and include such elements as europium and neodymium.

The superconducting metal oxide precursor film is deposited on the silicon or silicon dioxide substrate by any of the various physical deposition techniques well known in the art. Exemplary of physical deposition techniques are listed above. According to such techniques, the superconducting metal oxide precursor is deposited from a target or targets in a gas atmosphere wherein the target comprises one of the component materials of the film or a composite of the components of the film. The target may be in powder or compacted form. If it comprises a composite of the components of the film, they may be reacted or unreacted. In certain of the examples below wherein the precursor film was deposited by triode sputtering techniques, a target was prepared by hot pressing unreacted $Y_2O_3$, $BaCO_3$ and CuO powders. As would be apparent to those skilled in the art in view of the present disclosure, other materials such as $BaO_2$, $Cu_2O$, BaO, acetates of R, Ba, Cu, etc, may be used in making the target. In embodiments of the deposition technique wherein the target material is an oxide, the gas atmosphere may be selected from (i) inert gases, (ii) oxygen and (iii) a mixture of inert gas(es) and oxygen (a reactive gas). In those instances, wherein the targets are non-oxygen materials, e.g., Y, Ba and Cu, the gas atmosphere would necessarily comprise oxygen so as to deposit an RBaCuO material on the substrate. Preferably, during deposition of the precursor film, oxygen is present in the gas atmosphere. The amount of oxygen in the gas atmosphere is generally limited somewhat by the deposition techniques employed. Generally, in the physical deposition techniques discussed herein, the inert gas employed is preferably argon.

In the triode sputtering technique used to deposit a film on silicon and silicon dioxide substrates in Examples 1–5, a magnetically enhanced triode sputter gun was employed utilizing a single, compressed composite target of unreacted materials. This target was semi-insulating and therefore required radio frequency (rf) sputtering electronics. In triode sputtering, electrons are generated by a Joule heated filament. These electrons are attracted to a positively charged anode (of about 50–60 volts) situated across from the filament. Inert gas, in the examples herein being argon, was admitted between the filament and anode. The inert gas is ionized by the accelerated electrons creating a plasma of electrons and positively charged inert gas ions. The target is situated just below the plasma and a transverse magnetic field confines the plasma near the target surface. The sputtering process begins when rf power is applied to the target causing it to become negatively biased (up to several hundred volts) with respect to the plasma. The positive inert gas ions are attracted to the negatively charged target such that atoms from the target or atom complexes are physically removed via momentum transfer. These target atoms are redeposited on any substrate in its line of sight. Due to different sputtering yields for each different specie in the composite target, a substantial presputtering period (up to 20 hours) is usually needed to reach equilibrium for a new target. During this presputtering period, a shutter is utilized to prevent deposition onto the substrates. After this equilibrium is attained, subsequent presputtering of the target prior to deposition of other films from the target is generally only necessary for about 10 to 15 minutes to remove any surface contamination. Oxygen gas, which is reactive with the film materials, can be admitted near the substrate to insure essentially complete oxidation of the film. Flow meters regulate the amount of inert gas and reactive gas (oxygen) admitted into the system and the vacuum pumping system can be throttled to permit operation at a prescribed pressure developed by the gas(es). A usual operating pressure is 0.5 to 5.0 millitorr, but it can be as high as 20 millitorr. Flow rates are selected based on the size of the chamber and the pumping rate of the vacuum system employed. For example, the argon flow rates for the sputtering chamber having a volume of 100 liters (employed in the examples below) are optimally in the range of 10.0 to 35.0 standard cubic centimeters per minute (sccm); typically, 30.0 sccm is used for a chamber of that volume. The oxygen flow rate in the sputtering chamber of the examples is typically 0.1 to 5.0 sccm corresponding to a partial oxygen atmosphere of 1–3%.

The silicon or silicon dioxide substrate is placed opposite the target at a particular distance. The actual distance depends on the desired sputtering rate and thickness uniformity and also the necessary substrate isolation to prevent excessive substrate heating and ion bombardment. In the triode sputtering technique employed in the examples, this distance lies in the range of 25 to 150 mm with a typical distance being 60 mm. The substrates can also be mounted on a resistive heater which can heat the substrates during the deposition process, generally up to a temperature of less than about 650° C. The actual temperature to which the substrate might be heated prior to film deposition depends e.g., on the substrate used and the particular post growth annealing schedule. In the case of a silicon substrate on which the superconducting metal oxide precursor film has been deposited by the triode sputtering technique of the examples and annealed in oxygen at 900° C. for 10 seconds according to the invention method, we have found that it is preferable that the substrate (silicon) be unheated so as to promote better adhesion of the deposited film.

Other physical deposition methods suitable for use in this invention for applying the film onto the substrate are described in "Deposition Technologies For Films And Coatings", R. F. Bunshah, Editor, Noyes Publications, Parkridge, N.J., 1982, which text is hereby expressly incorporated by reference for its teachings relative to physical deposition techniques. Still other physical deposition methods, suitable for applying the film to the substrate are known to those skilled in the art and would be apparent in view of the present disclosure. For example, the film can be deposited by e-beam evaporation, ion-beam deposition, laser deposition and molecular beam epitaxy (MBE). In any method of depositing the superconducting metal oxide precursor film onto the substrate, including the preferred rf triode sputtering method, the conditions are most advantageously arranged so as to produce, after annealing, a film consisting essentially of a stoichiometric $RBa_2Cu_3O_{6.5-7}$. For a given target composition, parameters such as gas pressure, gas flow rate, power input, distance from target to the substrate can be varied and optimized to effect the formation of essentially stoichiometric metal oxide. Such optimization would be within the skill of those in the art in view of the present disclosure.

The precursor film deposited on the silicon or silicon dioxide substrate according to this invention is deposited in a thickness of between about 0.1 and about 3 $\mu m$. The optimal thickness of the film to be deposited would depend on its desired use. Selection of the thickness of the film deposited according to this invention would be within the skill of those in the art in view of the present disclosure. It is possible to vary the physical methods and conditions of deposition over a considerable range while producing R/Ba/Cu/O films which may be subjected to the rapid thermal annealing conditions of the invention. Additionally, while it is not necessary according to the disclosed invention to provide a buffer layer of another material between the substrate and the superconducting metal oxide film as has been suggested, e.g., by the above mentioned General Electric article, use of such an intermediate layer or layers in intimate contact with the substrate and film is not precluded in the invention. Use of an intermediate layer may serve, e.g., to improve adhesion, coverage, etc.

As discussed above, we have found that if we apply a special annealing schedule to the precursor films deposited on silicon and silicon dioxide substrates, the films have, after annealing in an oxygen atmosphere, substantially improved properties. This annealing procedure comprises heating the film to an annealing temperature in seconds rather than in minutes as has been commonly done, annealing the film in an oxygen atmosphere for seconds rather than the conventional minutes or even hours and subsequently rapidly cooling the film to less than 300° C. in less than 3 minutes, again more rapidly than that which has been previously suggested.

According to the method of the invention, the film/substrate composite is heated to a temperature between about 800° C. to 950° C., preferably 850°–950° C., in less than about 10 seconds. Most preferably, the annealing temperature is 900°–920° C. The composite may be heated, e.g., in an oxygen atmosphere. The composite is maintained at the temperature in an oxygen atmosphere for between about 5 and 25 seconds to anneal the film. The optimal annealing time would be dependent on the thickness of the film, thicker films generally requiring longer annealing times than thinner films. The composite is then cooled to less than about 300° C., preferably to room temperature, in less than about 3 minutes, preferably in about 30 to 80 seconds. Generally, when cooling the composite to less than about 300° C. in less than about 3 minutes, the composite is preferably cooled to less than about 400° C. in less than 10 seconds. If the substrate is silicon, preferably the annealing time is 8 to 12 seconds and if the substrate is silicon dioxide the annealing time preferably is 10 to 15 seconds.

One way to carry out such rapid steps is by means of a rapid thermal processor such as one used in silicon device technology. It has the capability through high intensity lamps to raise the temperature of the substrate to temperatures higher than 900° C. in less than 10 seconds, and after annealing, it has the capability to cool the substrate rapidly, e.g., from 950° C. to 200°–300° C. in less than one minute. When using such apparatus to carry out the method of this invention, the metal oxide films/silicon or silicon dioxide substrate composite is placed in the processor, such as the AG Associates Model No. 410, which is programmed to carry out an embodiment of the rapid thermal annealing schedule of the invention disclosed herein.

The invention will be further understood by referring to the following detailed examples. It should be understood that the subject examples are presented by way of illustration and not by way of limitation.

EXAMPLES

In all of the examples, the following substrate materials, processing techniques and testing procedures were used unless otherwise noted.

Silicon

P-type (100) single crystal silicon wafers having a thickness of 400 μm with resistivities of 20–30 ohm-cm were used as the silicon substrate and as the substrate on which was grown silicon dioxide as described below.

Cleaning Procedure

Circular wafers (i.e., disc-shaped wafers) of silicon having a diameter of 4" were first cleaned in a solution of $H_2O_2$ and $H_2SO_4$ (mixed in the ratio of 1:2 by volume) for 10 minutes. This step was followed by a 5 minute rinse in deionized water. Thereafter the native oxide was removed by a 30 second etch in buffered HF and the wafers were rinsed again in deionized water for 15 minutes after which they were spin-dried in a $N_2$ atmosphere.

Silicon Dioxide Growth

A silicon wafer cleaned by the above mentioned procedure was loaded into a furnace in a $N_2$ atmosphere at 800° C. The furnace temperature was then raised to 1000° C. and then the gas was changed from $N_2$ to dry oxygen. After 60 minutes of oxidation time the gas flow was switched back to $N_2$ and the wafer was annealed in $N_2$ for 30 minutes. This step was followed by an $O_2$ anneal for 30 seconds at 1000° C. to saturate the oxide layer. Finally, the temperature was decreased to 800° C. in the $N_2$ atmosphere and the wafer was removed from the furnace.

Wafer Transport

The cleaned silicon wafer and the oxidized silicon wafer, having a thickness of 50 nm were fractured into 2"×2" samples, sealed in plastic boxes, and then transported to a sputtering system located outside the cleanroom.

Sputtering

The substrate samples were loaded into the sputtering system generally within about ten minutes after their removal from the cleanroom. The sputtering target was prepared by hot pressing at 900° C. and 8000 psi unreacted $Y_2O_3$, $BaCO_3$ and $CuO$ powders in proportions corresponding to the stoichiometric $YBa_2Cu_3O_x$ composition. The powders remained essentially unreacted but were highly compacted with less than 5% Porosity. Argon with 1 to 3% oxygen was used as the sputtering gas at a pressure in the range of 1 to 10 mTorr. The deposition rate was on the order of 100 Å/min. The films were characterized by x-ray diffraction, scanning electron microscopy (SEM), transmission electron microscopy (TEM) and x-ray fluorescence.

Oxygen Anneal of Metal Oxide Film

A light-powered rapid thermal processor (AG Associates Model 410) was used for the oxygen anneal of the metal oxide film according to the method of the invention. An atmosphere of pure oxygen (industrial grade) was used in the annealing process.

Electrical Measurements

The resistance of the films was measured by standard four-contact dc and ac techniques. Currents in the range of 1 to 100 μA were used and the minimum voltage detectable was on the order of 10 nV. Our zero resistivity corresponds to resistivity values of less than $10^{-7}$ ohm-cm The resistance at room temperature is measured by a multimeter at two points about 3 mm apart.

EXAMPLE 1

This example compares the superconducting properties of metal oxide films made on sapphire and silicon substrates by conventional oxygen annealing schedules.

(a) The triode sputtering system described above was used to deposit a superconducting metal oxide film on single crystal sapphire as follows. After cleaning, the sapphire substrate was mounted on a resistive heater, the deposition chamber was closed and the vacuum pumping system was turned on to evacuate the chamber to low pressures, below about $10^{-6}$ torr. The target was formed as described above. A shutter was placed between the substrate and the target, the sputtering gas was admitted into the chamber and the triode gun was turned on. The power to the heater was also turned on to heat the substrate to a temperature of 440° C. After a few minutes of presputtering, the shutter was removed and the deposition of the Y/Ba/Cu/O film on the sapphire substrate began. After a time period of 200 minutes, a Y/Ba/Cu/O film 2 μm thick was deposited on the sapphire substrate. Subsequently, the sputter gun was turned off, the chamber was brought to atmospheric pressure and the substrate with the film was removed. The as-deposited film on the sapphire was amorphous and highly resistive (nonsuperconducting). The film was subsequently annealed in oxygen in a quartz tube placed inside a resistive tubular furnace, the temperature of which was controlled by conventional means. The oxygen was passed through the tube at a flow rate of 50 sccm. The annealing temperature was about 870° C. After annealing for about 1 hour, and cooling at a rate of 3° C./minute, the film was black and highly conducting. As described above, this annealing schedule is similar to ones commonly used in the art area for films on sapphire substrates. FIG. 1 shows the temperature dependence of the resistivity of the Y/Ba/Cu/O film on sapphire. The onset for superconductivity occurs above 90 K., but zero resistance is obtained at a considerably lower temperature of about 65 K. These results are similar to those obtained by the prior art annealing techniques on sapphire substrates. Higher annealing temperatures, e.g. above 870° C. for films on sapphire make the superconducting transition broader.

X-ray diffraction showed that the film on sapphire was polycrystalline. It contained mostly the orthorhombic $YBa_2Cu_3O_{7-y}$ phase and small amounts of other phases such as $Y_2BaCuO_5$. X-ray fluorescence study revealed that the film was deficient in Cu by about 20%. The Cu deficiency appears to be the main reason for the relatively low temperatures for which the resistance of these films becomes zero ($T_c(O)$). It is expected that when the Cu content in the films is increased, for example by increasing the Cu content in the target, the $T_c(O)$ will become larger, approaching the 85–90 K. reported in the literature.

Figure 2:
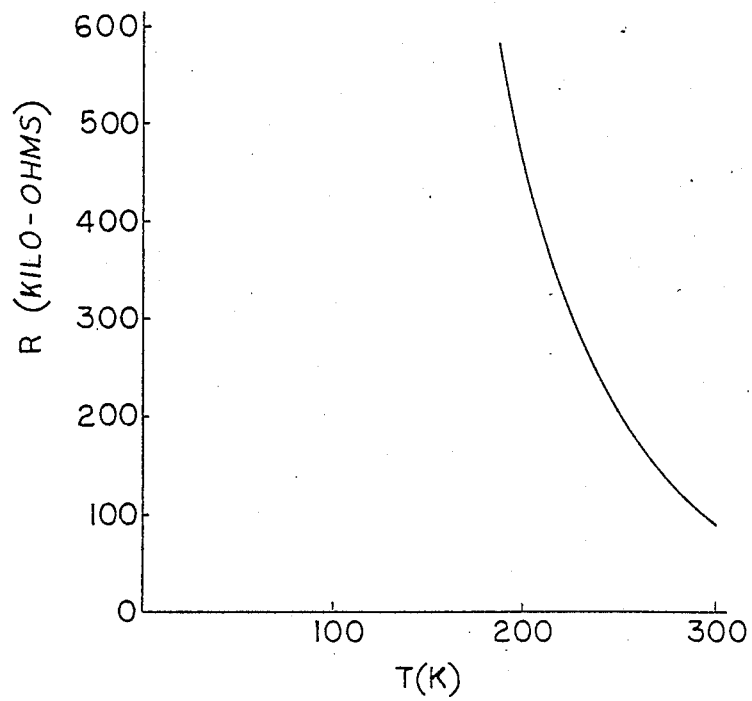
FIG. 2 is a graphical representation of resistance versus temperature for a Y/Ba/Cu/O film on a silicon substrate which was annealed in oxygen according to conventional annealing schedules.

(b) When the same physical deposition technique and oxygen anneal procedure described in Example 1(a) for a sapphire substrate was employed for a similar film deposited on a silicon substrate, it was found that the film after annealing in oxygen for only 10 minutes did not show a transition to the superconducting state (zero resistance) at any temperature down to liquid helium temperature (4.2 K.). Instead, as shown in FIG. 2, the resistance of this film showed a semiconducting behavior, rapidly increasing with decreasing temperature. Annealing for a longer period of time was found to increase the resistance of the film even further. This behavior is similar to that described in the literature for metal oxide films deposited on silicon and silicon dioxide substrates and annealed in oxygen according to conventional schedules. As recognized in the literature, this behavior arises from the rapid interdiffusion of Cu, Ba and Si during annealing.

EXAMPLE 2

Figure 3:
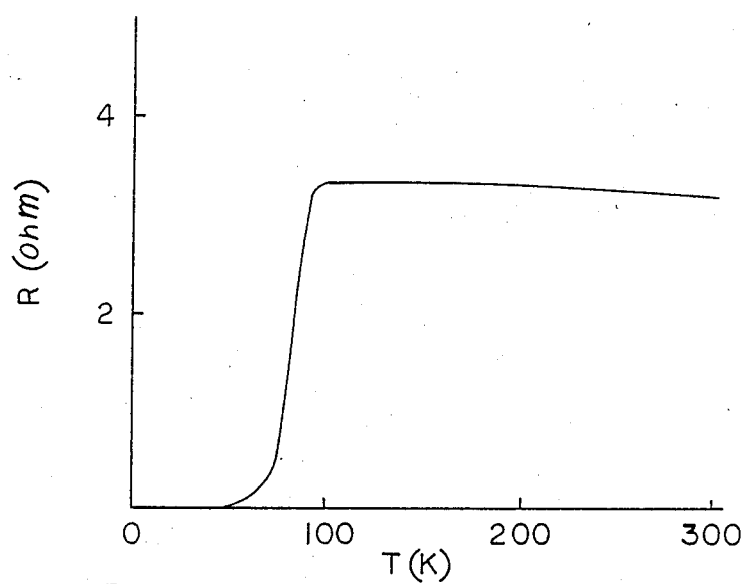
FIG. 3 is a graphical representation of the resistance versus temperature for a Y/Ba/Cu/O film on a silicon substrate annealed in an oxygen atmosphere by the rapid thermal annealing of the invention method.

In this example, a film of superconducting metal oxide on silicon was prepared according to the method of the invention. A film 2 μm thick was deposited on a cleaned silicon wafer by the triode sputtering system described above. According the annealing procedure of this invention, the film was heated to 920° C. in 5 seconds in oxygen, annealed in the oxygen for 10 seconds at 920° C. and cooled to room temperature in 80 seconds by means of a AG Associates model 410 rapid thermal processor. The film was superconducting, having a $T_c(O)=46$ K. FIG. 3 shows the resistance versus temperature of the metal oxide film on the silicon substrate.

EXAMPLE 3

Figure 4:
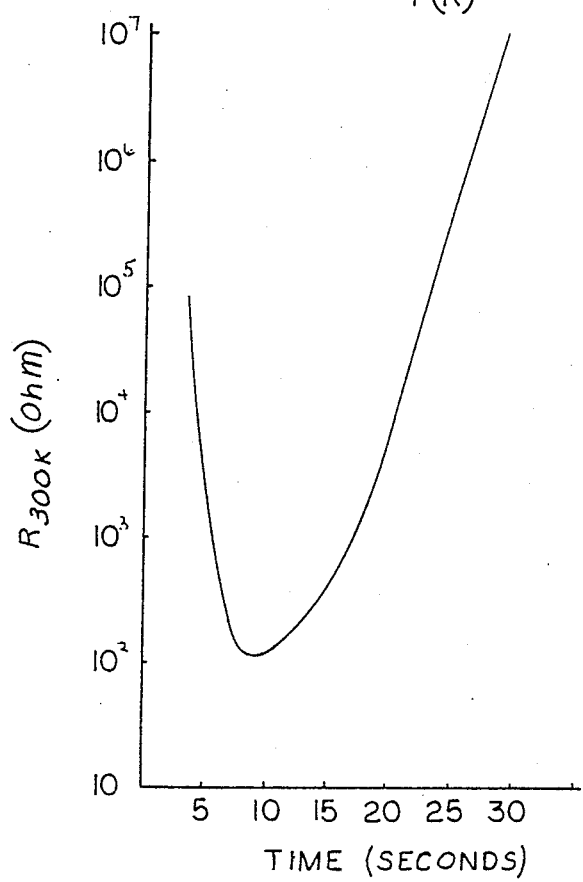
FIG. 4 is a graphical representation of the room temperature resistance of Y/Ba/Cu/O films on silicon substrates as a function of annealing time in an oxygen atmosphere.

In this example, four samples were prepared of a superconducting metal oxide film on a silicon substrate were prepared according to the method of the invention. Each of the samples was made by depositing a metal oxide film, 2 μm thick, on a silicon wafer by the triode sputtering system described above. The samples were annealed in oxygen by means of a AG Associates model 410 rapid thermal processor. For each sample the film was heated to 900° C. in 5 seconds in oxygen. The annealing time of the samples was varied with each sample, i.e., 5, 10, 15 and 30 seconds. The samples were all cooled to room temperature in 80 seconds. The room temperature resistance of the films on the samples as a function of the duration of the annealing period with the constant temperature of 900° C. is shown graphically in FIG. 4. It can be seen from FIG. 4 that the room temperature resistance of these films increases dramatically for films which were annealed less than five seconds and more than about 20 seconds. It has been shown by the prior art, that lower values of the room temperature resistivity generally correlate with better superconducting properties in $YBa_2Cu_3O_y$ materials.

EXAMPLE 4

In this example, a film of superconducting metal oxide on silicon dioxide was prepared according to the method of the invention. The silicon dioxide was grown on a wafer of silicon and exposed to oxygen as described above. The metal oxide film was deposited in a thickness of 2 μm by the triode sputtering system techniques of Example 2. The film was then processed by means of a AG Associates model 410 rapid thermal processor according to the following schedule. The film was heated to 920° C. in 5 seconds in oxygen, annealed at that temperature for 10 seconds and cooled to room temperature in 80 seconds. The film had a $T_c(O)=50$ K.

Figure 5:
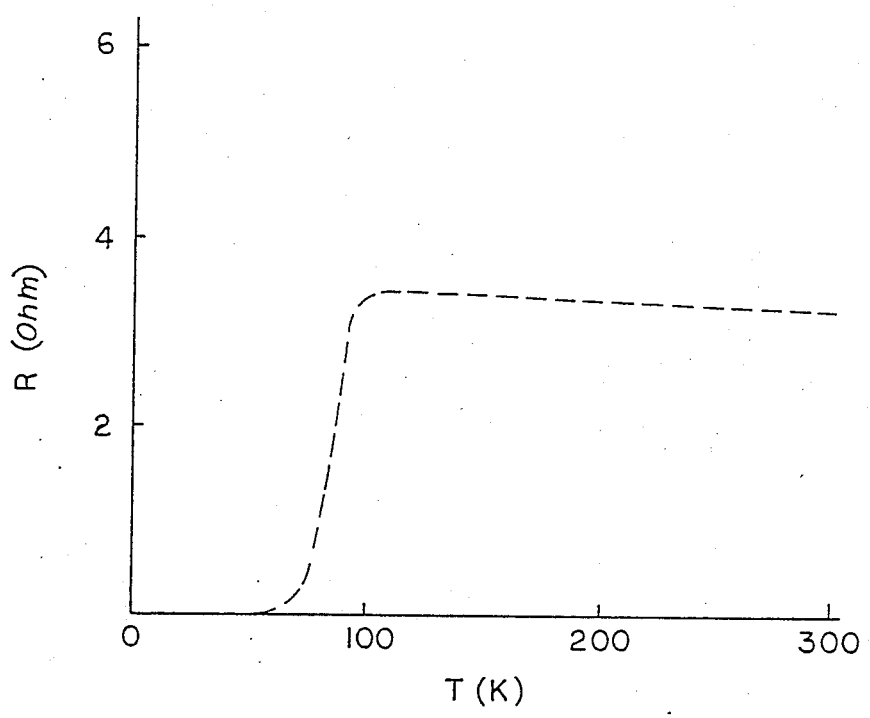
FIG. 5 is a graphical representation of the resistance versus temperature for Y/Ba/Cu/O film on a silicon dioxide substrate annealed in an oxygen atmosphere by the rapid thermal annealing of the invention method.

The resistance of the film versus temperature of the metal oxide film on the silicon dioxide substrate after annealing is shown in FIG. 5.

EXAMPLE 5

In this example, films (having thicknesses of 1 and 2 μm) of superconducting metal oxide on silicon are prepared as described in Example 2 and subjected to annealing in oxygen according to the method of the invention. The films are annealed at 920° C. according to the following schedule and the resultant films are superconducting.

| | 1 μm | 2 μm |
|---|---|---|
| Heating | 5 sec | 5 sec |
| Annealing | 8 sec | 10 sec |
| Cooling | 80 sec | 80 sec |

As can be seen from the annealing times and film thickness, optimally thicker films are annealed for longer periods of time.

EXAMPLE 6

The same rapid annealing procedure described above for films of YBaCuO deposited on silicon and silicon dioxide substrates by the triode sputtering system is applicable to films of other members of the RBaCuO superconducting oxides deposited on these types of substrates by other physical deposition methods. An example is given hereunder for a $EuBa_2Cu_3O_x$ film deposited on silicon by an electron beam deposition system.

Three separate e-guns are used, each for one of the metallic elements Eu, Ba, and Cu. The guns are placed at an angle with respect to each other in a vacuum chamber so that all of them point toward the silicon substrate. A shutter is placed between the three guns and the silicon substrate, the power to each of the guns is turned on and the fluxes of Eu, Ba and Cu are individually measured by separate crystal thickness monitors. The three fluxes are then adjusted (based on previous calibrations) to supply an overall particle flux at the silicon substrate that results in a EuBaCuO film with the desired stoichiometric 1:2:3 Eu:Ba:Cu composition. For this deposition on silicon, the substrate is not heated with the substrate heater. After the adjustment of the deposition rates from the three guns, the shutter is removed and the film deposition begins. Oxygen is introduced through a capillary, preferably in the vicinity of the substrate. The oxygen reacts with the incoming Eu, Ba and Cu as they are being deposited on the substrate. The fluxes from the three guns are continuously monitored and maintained constant through appropriate adjustment of the power to each of the e-guns by means of a simple feedback electronic circuit. For typical deposition rates of 400 Å/min, a 3-micron thick film is grown in about 80 minutes. After the completion of the deposition, the film on silicon is removed and placed in the rapid thermal processor for the post-growth anneal in oxygen. The time to heat the film/substrate combination to 920° C. is 5 seconds, the annealing time at 920° C. is 12 seconds and the cooling time to 200° C. is 30 seconds. The film has an onset for superconductivity of about 95 K. and a $T_c(O)$ of about 50 K.

In view of the disclosure, many modifications of this invention will be apparent to those skilled in the art. It is intended that all such modifications which fall within the true scope of this invention be included within the terms of the appended claims.

We claim:

1. A method of making a superconducting metal oxide film on a substrate selected from the group consisting of silicon and silicon dioxide, said method comprising:

depositing a thin film of a superconducting metal oxide precursor consisting essentially of R, Ba, Cu, and O by a physical deposition technique directly onto said substrate in a thickness between about 0.1 and 3 μm to form a film/substrate composite, wherein R is selected from the group consisting of rare earth elements and yttrium, which precursor film can be annealed in an oxygen atmosphere to yield a superconducting metal oxide film;

then heating said film/substrate composite to a temperature between about 800° C. and 950° C. in less than about 10 seconds;

then maintaining said film/substrate composite at said temperature in an oxygen atmosphere for between about 5 and 25 seconds to anneal said film; and then cooling said film/substrate composite to less than 300° C. in less than about 3 minutes.

2. The method according to claim 1, wherein the ratio of R:Ba:Cu present in said superconducting metal oxide precursor is 0.8–1.2:1.8–2.2:2.8–3.2.

3. The method according to claim 2, wherein said ratio of R:Ba:Cu is 1:2:3.

4. The method according to claim 1, wherein said film of said superconducting metal oxide consists essentially of $RBa_2Cu_3O_{6.5-7.0}$.

5. The method according to claim 1, wherein said substrate is silicon and said film is annealed in said oxygen atmosphere for between about 8 and about 12 seconds.

6. The method according to claim 1, wherein said substrate is silicon dioxide and said film is annealed in said oxygen atmosphere for between about 10 and 15 seconds.

7. The method according to claim 1, wherein said film is deposited by a sputtering technique.

8. The method according to claim 1, wherein said film is annealed in said atmosphere comprising oxygen at a temperature between about 850° C. and 950° C.

9. A method of making a superconducting metal oxide film on a substrate selected from the group consisting of silicon and silicon dioxide, said method comprising:

depositing a thin film of a superconducting metal oxide precursor consisting essentially of R, Ba, Cu, and O by a sputtering technique directly onto said substrate in a thickness between about 0.1 and 3 μm to form a film/substrate composite, wherein R is selected from the group consisting of rare earth elements and yttrium, which precursor film can be annealed in an oxygen atmosphere to yield a superconducting metal oxide film;

then heating said film/substrate composite to a temperature between about 850° C. and 950° C. in an oxygen atmosphere in less than about 10 seconds;

then maintaining said film/substrate composite at said temperature in said oxygen atmosphere for between about 5 and 25 seconds to anneal said film; and then cooling said film/substrate composite to less than 300° C. in less than about 3 minutes.

* * * * *